(12) United States Patent
Cheng

(10) Patent No.: US 7,358,037 B2
(45) Date of Patent: Apr. 15, 2008

(54) BINDER DIFFUSION TRANSFER PATTERNING OF A THICK FILM PASTE LAYER

(75) Inventor: Lap-Tak Andrew Cheng, Newark, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 792 days.

(21) Appl. No.: 10/762,719

(22) Filed: Jan. 22, 2004

(65) Prior Publication Data

US 2004/0173818 A1  Sep. 9, 2004

Related U.S. Application Data

(60) Provisional application No. 60/441,773, filed on Jan. 22, 2003.

(51) Int. Cl.
*H01L 21/00* (2006.01)
*G03F 7/00* (2006.01)

(52) U.S. Cl. .................. 430/324; 430/325; 430/326
(58) Field of Classification Search ............. 430/324, 430/330, 325, 326
See application file for complete search history.

(56) References Cited

U.S. PATENT DOCUMENTS

| | | | |
|---|---|---|---|
| 5,455,145 A | 10/1995 | Tarumoto | |
| 5,601,638 A | 2/1997 | Fukuda et al. | |
| 5,624,782 A * | 4/1997 | Hayakawa et al. | 430/198 |
| 6,258,514 B1 | 7/2001 | Montgomery | |
| 2005/0032254 A1* | 2/2005 | Cheng et al. | 438/20 |

FOREIGN PATENT DOCUMENTS

| | | | |
|---|---|---|---|
| EP | 0 713 357 | | 5/1996 |
| EP | 1 223 470 | | 7/2002 |
| EP | 1223470 | * | 7/2002 |
| JP | 55-041728 | | 3/1980 |
| WO | WO 01/99146 | | 12/2001 |

* cited by examiner

*Primary Examiner*—Mark F. Huff
*Assistant Examiner*—Caleen O. Sullivan

(57) ABSTRACT

The present invention concerns a process for the fabrication of electrical and electronic devices. A polymer film is patterned on a substrate. A thick film paste is deposited over the patterned polymer. The thick film paste is dried under conditions which allow diffusion of the polymer into the thick film paste. This renders the diffused area insoluble in alkaline development solution.

16 Claims, 5 Drawing Sheets

Processing steps for binder diffusion transfer imaging where the polymer film is a photo resist

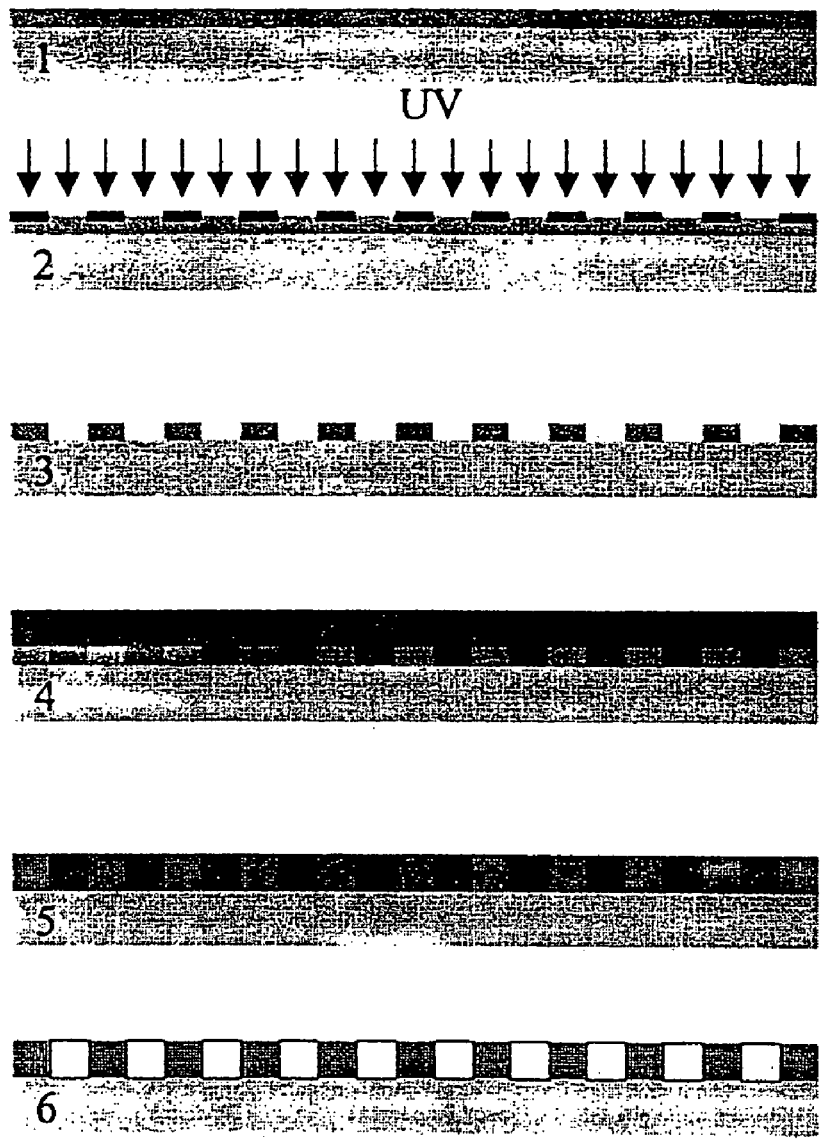
Figure 1: Processing steps for binder diffusion transfer imaging where the polymer film is a photo resist

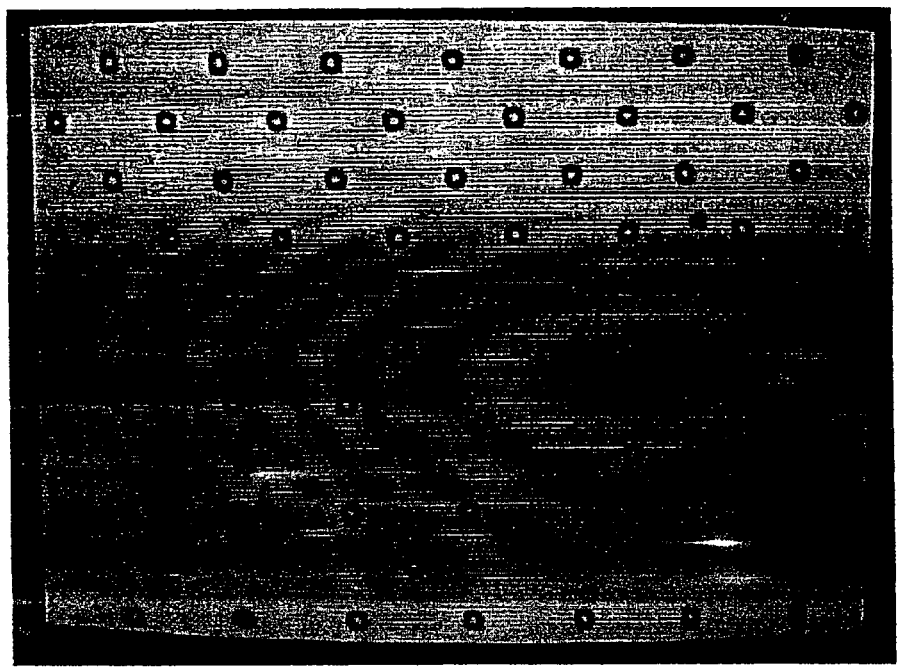
Figure 2: Showing 50 um x 50 μm photo-resist squares after resist development

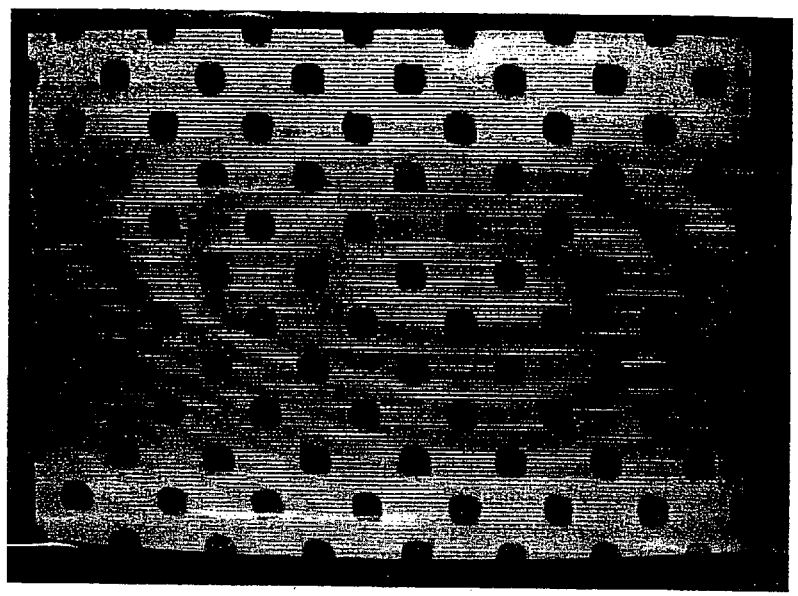
Figure 3: Showing 75 μm x 75 μm CNT paste squares after paste wash-out in alkaline solution

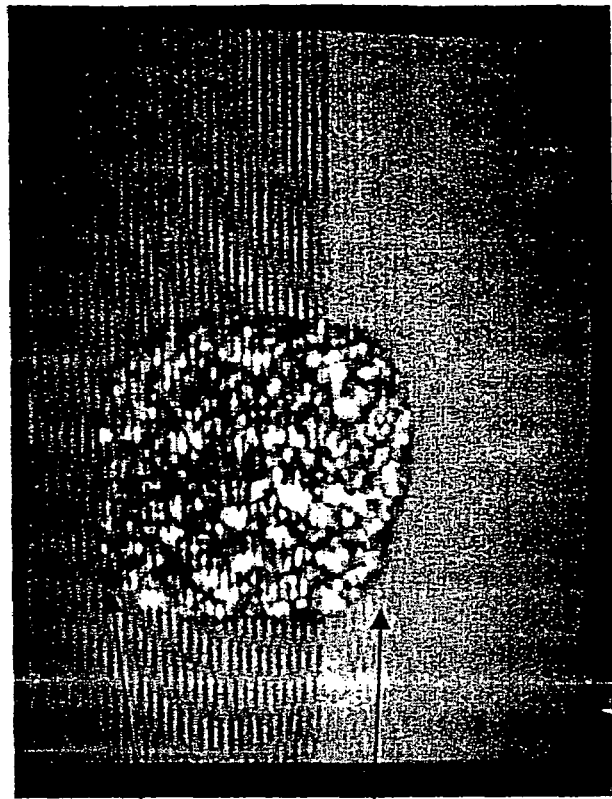
About 75 μm square paste pad
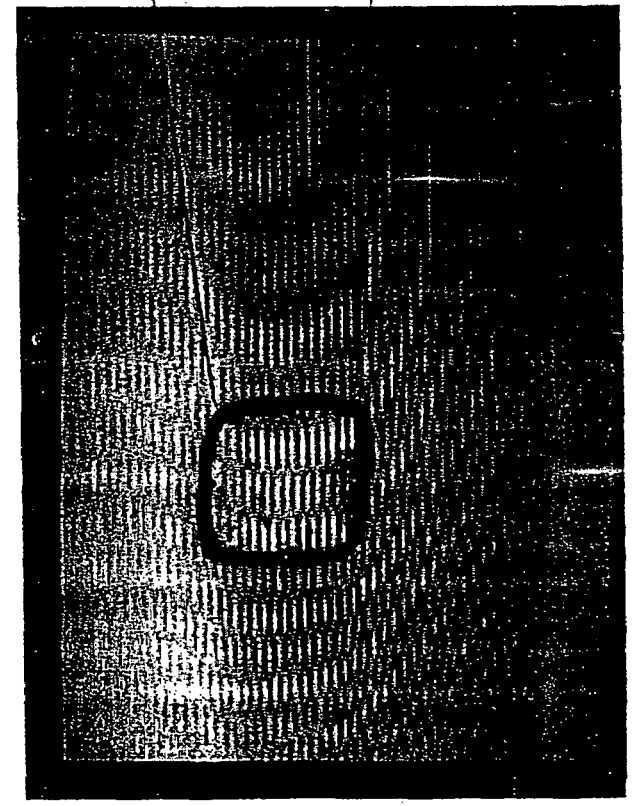
50 μm square resist pad
Figure 4: Showing the dimension gain which occurs during diffusion transfer;
(a) 50 μm x 50 μm photo-resist squares
(b) 75 μm x 75 μm CNT paste.squares

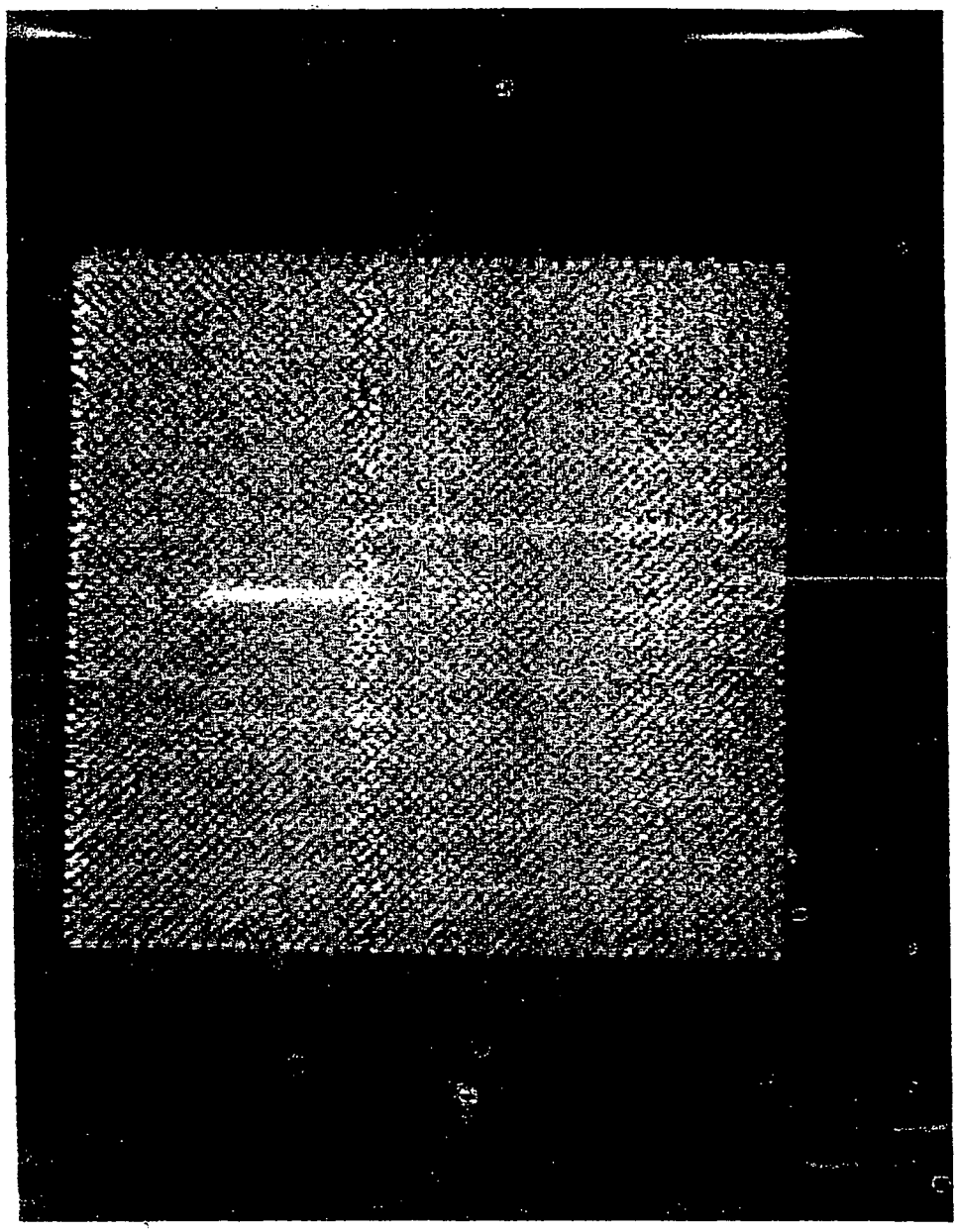
Figure 5: Showing electron field emission illumination of the anode by the CNT paste squares array. Image was taken at 3 kV and 50 μamp of anode current.

BINDER DIFFUSION TRANSFER PATTERNING OF A THICK FILM PASTE LAYER

FIELD OF THE INVENTION

The present invention relates to a process for the fabrication of electrical and electronic devices using a polymer film which is a photo-resist and a thick film paste. The process allows thick film paste deposits of fine resolution. The present invention also relates to devices made with thick film pastes that are patterned using a diffusion layer made from a patterned polymer or photoresist.

TECHNICAL BACKGROUND

Bouchard et al (WO 01/99146) describe a field emitter composition and a process for improving the field emitter, but do not address the compatibility of the composition with other components or materials used in the fabrication of a device.

Fukuda et al (U.S. Pat. No. 5,601,638) describe a thick film paste using 2-tetradecanol solvent, but do not discuss compatibility of the paste and its solvent with a photoresist protective layer.

SUMMARY OF THE INVENTION

The present invention describes a process for fabricating an electrical or electronic device comprising a thick film paste deposited over a patterned polymer or photoresist. The structure is then heated to allow for the diffusion of the polymer film or photoresist into the thick film paste.

The present invention includes a process comprising:
 a) depositing a patterned film of polymer A on a substrate;
 b) depositing a thick film paste over the patterned film of polymer A;
 c) drying of the thick film paste during which the patterned polymer A diffuses into the paste layer thus transferring the pattern to the paste layer; and
 d) removing the excess thick film paste from areas which polymer A has not diffused into by exposing the paste layer to a paste developer solution which has poor solubility to polymer A.

The present invention also includes a process comprising:
 a) depositing a positive photo resist on a substrate
 b) masking a pattern on the photoresist
 c) exposing the photoresist to light through the patterned mask
 d) developing the photoresist
 e) depositing thick film paste over the patterned photoresist
 f) Drying the thick film paste
 g) Removing the excess thick film paste that has not mixed with the photo resist.

The present invention further discloses the above-described processes further comprising the additional step of firing the substrate patterned with the thick film paste.

The present invention additionally describes the above-described process as further comprising the step of activating the thick film paste.

The present invention also includes an electrical or electronic device fabricated by the first or second of the above-described processes.

BRIEF DESCRIPTION OF THE DRAWINGS

FIG. 1 shows the processing steps for binder diffusion transfer imaging where the polymer film is a photoresist.
FIG. 2 shows photoresist squares after resist development.
FIG. 3 shows carbon nanotube paste squares after paste wash-out in alkaline solution.
FIG. 4 shows the dimension gain of the paste as compared to the resist which occurs during diffusion transfer.
FIG. 5 shows electron field emission illumination of the anode by an array of carbon nanotube paste squares.

DETAILED DESCRIPTION OF THE INVENTION

This invention relates to a novel process in which a pattern of a film of polymer A is formed on a substrate. Polymer A is selected to be soluble in the solvent of a later-applied thick film paste. Such solvents are organic solvents such as ketones, alcohols, esters, ethers, and aromatics, including but not limited to texanol and β-terpineol. Polymer A may be, but is not limited to phenolic resins, DNQ/Novalac resists, acrylic polymers, polymers with pendent t-butyl groups, polystyrene, and ethyl cellulose.

The pattern of a film of polymer A can be formed by various means including by not limited to stencil printing, inkjet printing, and photopatterning. For photo-patterning, the polymer A is a photoresist. This photo-resist can be of novalac-type positive photoresist or chemical amplified type positive photoresist.

After deposition and patterning of a Polymer A film, a thick film paste formulated with an alkaline soluble binder and organic solvent is deposited over the polymer A pattern. Techniques such as screen printing may be used to apply the thick film paste deposit. After deposition, the resulting thick film paste film is dried at a temperature between 50° C. and 100° C. for between 15 and 60 minutes. During this drying step, the thick film paste solvent induces dissolution of the patterned polymer A and subsequent diffusion mixing of the polymer A into the thick film paste deposit. The extent of diffusion of the polymer A into the thick film paste deposit during the drying step can be controlled by parameters such as drying temperature and time. It can further be controlled by the solvent choice for the thick film paste. Since polymer A (e.g. novalac-type photoresists) is insoluble in the alkaline paste developer, its diffusion into the thick film paste during drying renders the diffusion regions of the paste insoluble to alkaline development. A subsequent development step, either alkaline spray or ultrasonic treatment, results in removal of the thick film paste deposit from regions where the polymer A was not present. This novel process is useful in fabrication of electrical and electronic devices comprising deposits of thick film paste.

The process of the present invention is useful in achieving fine feature patterning of a thick film paste, which by itself has only limited patterning resolution by screen or stencil printing. Photo-patterning of various thick-film pastes are often limited by the solids contents of the pastes, which tend to reduce the optical transparency of some thick film pastes. Binder diffusion transfer patterning provides a simple method of obtaining fine feature patterning of a thick film paste by separating the patterning process from the thick film paste to a second polymeric layer.

It is particularly convenient to use a photo-resist polymer for fine feature pattern formation. Photo resists may contain polymers, dissolution inhibitors, monomers, photo-initiators, photo-acid generators, and/or solvent. The thick film paste may contain glass frit, inorganic powders, metallic powders, binder polymer, photo-active monomers, initiators and/or solvent. Special thick film pastes for use as electron field emitters in displays additionally contain carbon nanotubes.

As is frequently practiced by those who are skilled in the art, common photo resists such as the DNQ/Novalac and the chemically amplified resist are used for fine feature patterning. Feature size of below 1 micron is routinely achieved. In a DNQ/Novalac type resist, the DNQ, a solubility inhibitor, is decomposed upon exposure to UV radiation rendering the exposed region soluble in a weakly basic developer. In a chemically amplified resist, a photo acid generator is included in the resist formulation. The acid generated upon irradiation can remove a tertiary butyl group from the polymer of the resist. With the butyl group removed, the polymer then becomes soluble in an alkaline or basic developer. The unexposed region of the photo-resist is highly resistant to dissolution in alkaline or basic developer. Additionally, these resists are typically highly soluble in most organic solvents such as ketones, alcohols, esters, ethers, long chain acetates and aromatics. These solvents, including but not limited to texanol and β-terpineol, are also often used to formulate many thick film pastes. For thick film pastes formulated with alkaline soluble binder polymers, a dry paste film can be readily washed off by spraying with an alkaline developer or soaking in the developer while agitated by ultrasonic action. The thick film paste is formulated with a solvent system which will dissolve a paste binder polymer and polymer A. The paste binder polymer is additionally soluble in a development solvent or solution in which polymer A has poor solubility. The paste binder polymer may be, but is not limited to acrylic polymers with carboxyl groups, acrylic polymers with acidic groups, polyvinylalcohol, co-polymers of polyvinylalcohol and polyvinylacetate, and polyhydroylstyrene. By using a novalac-type or a chemically amplified type photo-resist together with an alkaline soluble thick film paste, fine feature patterning of the thick film paste can be achieved by the binder diffusion transfer patterning process disclosed in this invention.

In the process described by the present invention, the feature size of the resulting thick film paste deposit is related but not identical to the feature size of the pattern in the polymer film or photoresist. Due to the nature of a diffusion controlled process, there is generally an expansion of about 30% to 50% of the dried thick film paste deposit as compared to the initial polymer or photoresist pattern element. This expansion can however be controlled or limited by controlling various processing parameter such as the polymer layer thickness, the drying temperature, drying time, as well as paste solvent choice.

An electronic device fabrication process utilizing the process of the present invention is illustrated in FIG. 1. A photo-resist is deposited on top of a substrate (1). This photo-resist is commonly the DNQ/Novolak type. Other type of photo-resist such as the chemically amplified photo-resist (APEX resist from IBM) can also be used. An external photo-mask (2) is placed on top and in intimate contact with the photo-resist, which is then exposed to UV radiation from top of the photo-mask. The resist is developed (3) in mildly basic aqueous solution (e.g. 1% sodium hydroxide). Since the novalac or chemically amplified type of resists work in the positive mode, the exposed area of the resist is dissolved revealing the substrate surface. An organic solvent based and alkaline developable thick film paste (4) is then deposited on the substrate over-coating the photo-resist and filling the vacancy generated by photo development of the resist layer. The thick-film paste deposit is then dried at 50° C. to 100° C. for 15 to 60 minutes (5) during which time the solvent in the thick film paste induces mixing of the novalac resist into the thick film paste thus rendering the mixed area insoluble to alkaline development. The thick film paste is then developed (6) with a spray of aqueous alkaline (ex. 0.5% sodium carbonate) or by ultrasonic treatment to remove paste in areas where the resist is not mixed with the thick film paste.

The thick film paste device at this stage of processing is useful as an intermediate in the fabrication of a fired thick film paste. The dried and developed mixture of patterned thick film paste and photo-resist is then fired at 300 to 800° C. for 5 to 30 minutes in either air or inert gas atmosphere. The organic constituents, including the mixed photo-resist are burned off in the firing step, leaving a sintered thick film paste.

Bouchard et al (WO 01/99146) describe a thick film paste containing carbon nanotubes for use as field emitters and a process for significant improvement of the field emission performance. The improvement process comprises laminating the thick film paste deposit with a film of polymer and then stripping off the laminated film. For thick film pastes designed for use as field emitters, this activation step can also be performed.

EXAMPLES

The following examples illustrate the use of the binder diffusion transfer method to pattern a thick film paste containing carbon nanotubes in the fabrication of an electron field emission device.

A novalac type photo-resist AZ4620 obtained from Clariant Cooperation was spin coated on an ITO coated glass substrate. A spinning speed of 3000 rpm and a spinning time of 45 sec was used. The novalac polymer film was dried on a 95° C. hot plate for 5 minutes. A 6 micron thick novalac polymer film was obtained after drying. A photomask consisting of optical dark squares of 50 micron×50 micron dimension was used to expose the photo-resist to UV (350-450 nm) radiation with a exposure dose of about 150 mJ/cm². The substrate is developed in AZA21K developer solution also obtained from Clariant for 45 sec. FIG. 2 show the patterned array of polymer squares.

An alkaline developable thick film paste which contains binder polymers, silver particles, glass frit, and carbon nanotubes was prepared using texanol as the paste solvent. A blanket film of the CNT paste was screen printed on the substrate over-coating the patterned photo-resist. A C400 mesh screen was used for printing. The CNT paste film was dried in a force air convection oven at 80° C. for 20 minutes. The thickness of the dried CNT paste film was found to be 8 micron.

The dried CNT paste film was sprayed with 0.5% NaCO₃ aqueous solution for 30 seconds during which the CNT paste film was washed away from regions where no novalac resist was deposited. Where novalac resist was deposited, a rounded square of CNT paste film remains after alkaline development. FIG. 3 shows the rounded squares of CNT paste which have a dimension of about 75 mircron×75 micron. Therefore a linear dimensional gain of 50% was observed. The thickness of the CNT squares was measured to be about 8 μm. FIG. 4 illustrates the dimension increase of the thick film paste square as compared to the initial photoresist square.

The substrate was fired in a 9 zone belt furnace set at a maximum temperature of 525° C. with a dwell time of 20 minutes at the maximum temperature zone. The fired substrate was activated by the adhesive activation method using a tape coated with pressure sensitive adhesive. The substrate used as a cathode in an electron field emission diode consisting of a cathode deposited with squares of CNT paste and an anode consisting of an ITO plate coated with P13 phosphor particle. The cathode and anode was separate by two 1 mm thick glass spacers. The diode assembling, with the cathode connected to a high voltage pulsed power supply and the anode connect to ground through an electrometer, was then placed into a vacuum chamber and evacuate to a background pressure of below 1×E-6 torr. High current electron field emission was observed when the cathode was energized by a high voltage pulse train consisting of voltage pulses at 100 Hz and duration of 20 micro second. An anode field emission current of 50 milli amp was measured. FIG. 5 shows electron field emission illumination of the anode by the CNT paste squares array produced with the binder diffusion transfer patterning process of the present invention.

What is claimed is:

1. A process for depositing on a substrate a thick film paste composition that comprises a solvent, comprising
   (a) providing on the substrate a patterned layer of a polymer that is soluble in the solvent,
   (b) depositing the thick film paste composition on the patterned layer,
   (c) dissolving polymer with the solvent to diffuse polymer into the thick film paste composition, and
   (d) removing any thick film paste composition into which polymer has not diffused.

2. The process of claim 1 comprising the further step of firing the substrate patterned with the thick film paste composition.

3. The process of claim 2 further comprising the step of activating the thick film paste composition.

4. The process of claim 1 wherein the polymer is selected from the group consisting of phenolic resins, DNQ/Novalac resists, acrylic polymers, polymers with pendent t-butyl groups, polystyrene, and ethyl cellulose.

5. The process of claim 1 wherein the patterned layer of polymer is printed on the substrate.

6. The process of claim 1 wherein the polymer comprises a photoresist.

7. The process of claim 6 wherein the photoresist comprises a positive working photoresist.

8. The process of claim 1 wherein the solvent comprises an organic solvent.

9. The process of claim 8 wherein the organic solvent is selected from one or more of the group consisting of ketones, alcohols, esters, ethers, long chain acetates and aromatics.

10. The process of claim 1 wherein the thick film paste comprises one or more of a metallic powder, a photo active monomer and an initiator.

11. The process of claim 1 wherein the thick film paste comprises carbon nanotubes.

12. The process of claim 1 wherein the step (c) of dissolving polymer comprises a step of drying the thick film paste.

13. The process of claim 1 wherein the step (d) of removing any thick film paste composition into which polymer has not diffused comprises a step of developing the deposited thick film paste with a developer that has poor solubility to the polymer.

14. The process of claim 13 wherein the developer comprises an alkaline spray or an ultrasonic treatment.

15. The process of claim 1 further comprising a step of fabricating an electronic device that comprises incorporating the substrate on which the thick film paste composition has been deposited into the electronic device.

16. The process of claim 1 wherein the fabricated electronic device comprises an electron field emitter.

* * * * *